(12) United States Patent
Bortman et al.

(10) Patent No.: US 9,450,511 B1
(45) Date of Patent: Sep. 20, 2016

(54) DIFFERENTIAL SIGNAL DETECTOR AND FULL WAVE RECTIFIER CIRCUIT THEREOF WITH COMMON MODE SIGNAL REJECTION

(71) Applicant: CADENCE DESIGN SYSTEMS, INC., San Jose, CA (US)

(72) Inventors: Santiago L. Bortman, Chevy Chase, MD (US); Eric H. Naviasky, Ellicott City, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 218 days.

(21) Appl. No.: 14/323,293

(22) Filed: Jul. 3, 2014

(51) Int. Cl.
*G05F 3/16* (2006.01)
*H02M 7/25* (2006.01)

(52) U.S. Cl.
CPC ......................................... *H02M 7/25* (2013.01)

(58) Field of Classification Search
CPC ............................................................ G05F 5/00
USPC ....... 323/271, 272, 275, 278, 281, 285, 289, 323/311–317
See application file for complete search history.

(56) References Cited

U.S. PATENT DOCUMENTS

| | | | | |
|---|---|---|---|---|
| 4,704,572 A * | 11/1987 | Melbert | ................... | G05F 1/573 323/275 |
| 5,412,309 A * | 5/1995 | Ueunten | ................... | G05F 3/267 323/303 |
| 5,600,234 A * | 2/1997 | Hastings | ................... | G05F 1/575 323/282 |
| 5,627,486 A * | 5/1997 | Gross | ...................... | G05F 3/265 323/316 |
| 5,892,381 A * | 4/1999 | Koifman | ................. | G05F 1/468 323/314 |
| 6,424,131 B1 * | 7/2002 | Yamamoto | ......... | H03K 17/0822 323/282 |
| 7,157,944 B1 | 1/2007 | Wang et al. | | |
| 7,183,756 B1 * | 2/2007 | Dikken | ................... | G05F 3/262 323/280 |
| 7,233,772 B1 * | 6/2007 | Darabi | ................... | H03B 21/01 323/237 |

* cited by examiner

*Primary Examiner* — Adolf Berhane
*Assistant Examiner* — Nusrat Quddus
(74) *Attorney, Agent, or Firm* — Rosenberg, Klein & Lee

(57) ABSTRACT

A full wave rectifier (270) for use as part of a differential signal detector (400) detects both high and low envelopes of differential signals ($RX_a$, $RX_b$) at a pair of differential inputs (202, 204) and provides a sense signal ($V_{SENSE}$) at an output (220) thereof. The differential signal detector (400) includes both the full wave rectifier (270) and a voltage reference source (260) having a circuit architecture in common, and a comparator for comparing the sense signal ($V_{SENSE}$) with a reference voltage ($V_{REF}$). The circuit configuration of both the full wave rectifier (270) and the voltage reference source (260) include first and second differential input circuits (271 and 273, 261 and 263) each including a pair of field effect transistors (2722, 2742 and 2762, 2782; 2622, 2642 and 2662, 2682) of different conductivity type having respective source terminals (2728, 2748; 2768, 2788; 2628, 2648; 2668, 2688) coupled together.

29 Claims, 8 Drawing Sheets

DIFFERENTIAL SIGNAL DETECTOR AND FULL WAVE RECTIFIER CIRCUIT THEREOF WITH COMMON MODE SIGNAL REJECTION

BACKGROUND OF THE INVENTION

1. Field of the Invention

This disclosure directs itself to a full wave rectifier for use in the detection of differential data signals and to a differential signal detector including a pair of differential inputs and that single full wave rectifier coupled to the pair of differential inputs for detecting both high and low envelopes of signals at the pair of differential inputs and providing a sense signal at an output thereof. In particular, the disclosure directs itself to a full wave rectifier circuit having first and second differential input circuits. Each of the input circuits including a pair of field effect transistors of different conductivity type and having source terminals coupled together. More in particular, this disclosure directs itself to a differential signal detector having both a full wave rectifier and a voltage reference source with a common circuit configuration. The circuit configuration of both the full wave rectifier and the voltage reference source include first and second differential input circuits, each including a pair of field effect transistors of different conductivity type having respective source terminals coupled together.

2. Prior Art

High speed serial data communication is widely used using differential inputs to provide noise immunity. Contemporary systems require low power dissipation in combination with high performance. One way power is saved is through the use of a "sleep mode" where portions of the system are idle or shutdown when not needed. At the receiving end of a high speed differential signaling system, there are a number of circuits that can be idled when no signal is present on the data lines. Thus, such systems employ a signal detection circuit to signal the presence of data on the differential data lines.

A prior art signal detection circuit 100, illustrated in FIG. 1, includes a full wave rectifier circuit 20 to detect envelopes of signals at the pair of differential inputs. However, the prior art rectifier 20 does not have high immunity to common mode voltage signals. Accordingly, a preamplifier 10 in employed to provide the common mode voltage immunity lacking in the rectifier 20.

Preamplifier 10 is connected to the differential data input terminals 202 and 204 and couples the differential data signals $RX_a$ and $RX_b$ to the rectifier 20 on the coupling lines 6 and 8. The rectifier 20 responds to the input data with the output of a $V_{SENSE}$ signal output at the output terminal 22. The $V_{SENSE}$ signal is coupled to an input terminal 34 of a comparator 30. The comparator 30 compares the $V_{SENSE}$ signal with a reference voltage ($V_{REF}$) input to terminal 32 of the comparator 30. If the voltage $V_{SENSE}$ signal exceeds $V_{REF}$ voltage, then a signal data detection signal is output at the output terminal 36 of comparator 30.

The preamplifier 10 required by system 100 must operate at the data rate of the high speed differential data, which in turn requires considerable power dissipation in a device that must be continuously active. Thus, there is a need for a signal detector employing a full wave rectifier with sufficiently high common mode noise immunity to obviate the need for a preamplifier in the differential data signal detector.

SUMMARY OF THE INVENTION

A full-wave rectifier circuit for detection of differential input signals and common mode signal rejection is provided. The full-wave rectifier circuit includes a first differential input circuit having a pair of first field effect transistors (FETs) of different conductivity type. Each first FET has a control gate coupled to a respective differential input. One of the pair of first FETs has a drain coupled to an output node. The full-wave rectifier circuit further includes a second differential input circuit having a pair of second FETs of different conductivity type. Each second FET has a control gate coupled to one of the differential inputs corresponding to the differential input coupled to the control gate of one of the first FETs of opposite conductivity type. One of the pair of second FETs has a drain coupled to the output node.

From another aspect, a full-wave rectifier circuit for differential input signal detection and common mode signal rejection is provided. The full-wave rectifier circuit includes a first differential input circuit including a pair of first field effect transistors (FETs) of opposite N and P conductivity types having respective source terminals connected together. A drain of one of the pair of first FETs is coupled to an output node. Each of the pair of first FETs has a control gate respectively coupled to a pair of differential signal inputs. The full-wave rectifier circuit further includes a second differential input circuit including a pair of second FETs of opposite N and P conductivity types having respective source terminals connected together. A drain of one of the pair of FETs is coupled to the output node in common with the drain of the one of the pair of first FETs. Each of the pair of second FETs has a control gate respectively coupled to the pair of differential signal inputs. An output voltage is generated at the output node responsive to detection of a differential voltage across the pair of differential signal inputs.

From yet another aspect, a differential input signal detector is provided. The differential input signal detector includes a pair of differential inputs. Further, the differential input signal detector includes a full wave rectifier having a first differential input circuit coupled to the pair of differential inputs for detecting a differential signal of a first polarity, a second differential input circuit coupled to the pair of differential inputs for detecting a differential signal of a second polarity and an output node coupled to both the first differential input circuit and the second differential input circuit. The full wave rectifier generates a signal at the output node responsive to input of either the differential input signal of the first polarity or the differential input signal of the second polarity. The differential input signal detector further includes a reference voltage circuit having a first common mode input circuit coupled to a first of the pair of differential inputs, a second common mode input circuit coupled to a second of the pair of differential inputs and a reference output node coupled to both the first common mode input circuit and the second common mode input circuit. The reference voltage circuit generates a reference voltage at the reference output node thereof having compensation for common mode effects. Still further, the differential input signal detector includes a comparator having a first input couple to the output node of the full wave rectifier and a second input coupled to the reference output node of the reference voltage circuit. The comparator generates an output signal indicative of a differential input signal being detected responsive to a voltage of the signal at the output node of the full wave rectifier being greater than the reference voltage at the reference output node.

From still another aspect, a differential signal detector is provided. The differential signal detector includes a full wave rectifier having a circuit configuration defined by (a) a pair of first field effect transistors (FETs) of different conductivity type having respective source terminals connected together and respective control gates each coupled to one of a pair of differential inputs, one of the pair of first FETs having a drain coupled to a first output node, and (b) a pair of second FETs of different conductivity type having respective source terminals connected together and respective control gates each coupled to one of the pair of differential inputs, one of the pair of second FETs having a conductivity type in common with the one of the pair of first FETs and having a drain coupled to the first output node. An output voltage is generated at the first output node responsive to detection of a differential input signal at the control gates of the pair of first FETs or the pair of second FETs. The differential signal detector further includes a reference voltage circuit having a circuit configuration in common with the full wave rectifier. The reference voltage circuit has a second output node generating a reference voltage having compensation for common mode effects. Further, the differential signal detector includes a comparator having a first input couple to the first output node and a second input coupled to the second output. The comparator generates an output signal indicative of a differential input signal being detected responsive to a voltage at the first output node exceeding the reference voltage at the second output node.

From a further aspect, a differential signal detector is provided. The differential signal detector includes a pair of differential inputs, and a full wave rectifier coupled to the pair of differential inputs for detecting both high and low envelopes of signals at the pair of differential inputs and providing a sense signal at an output thereof. The differential signal detector further includes a reference voltage circuit having inputs coupled to the pair of differential inputs for a compensating a reference voltage output therefrom. The reference voltage circuit has a circuit configuration in common with that of the full wave rectifier. Still further, the differential signal detector includes a comparator having a first input couple to the output of the full wave rectifier and a second input coupled to the output of the reference voltage circuit. The comparator generates an output signal indicative of a differential input signal being detected responsive to a voltage of the sense signal being greater than the reference voltage.

DESCRIPTION OF THE PREFERRED EMBODIMENTS

Figure 1:
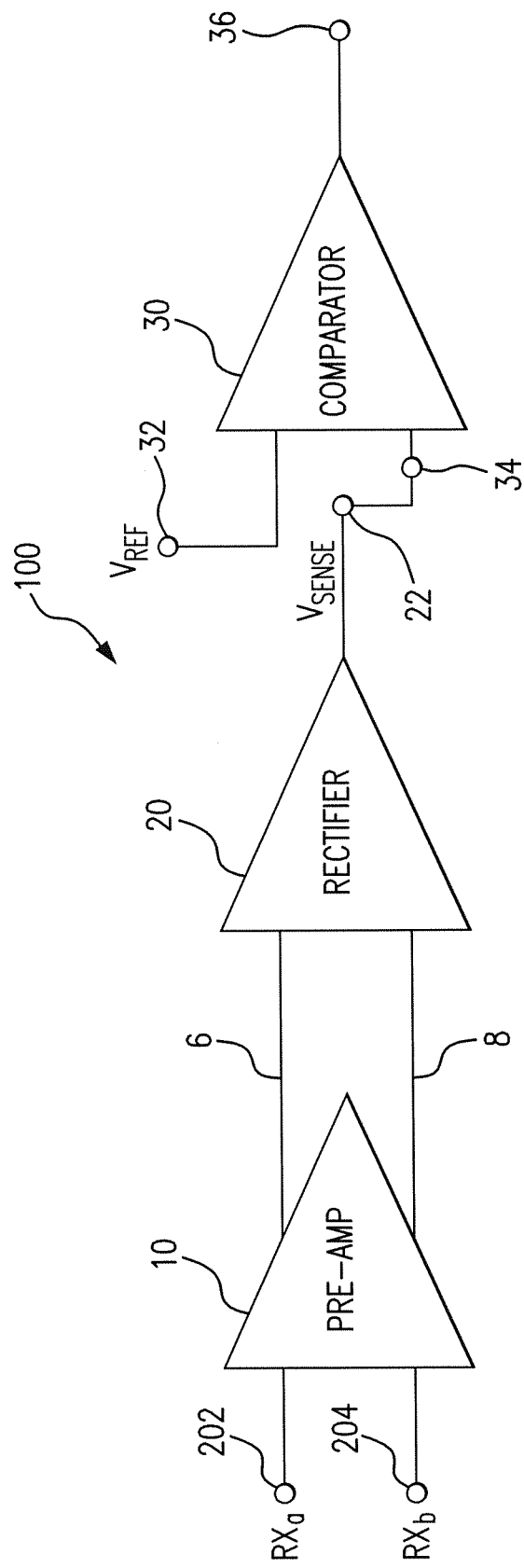
FIG. 1 is a block diagram of a conventional signal detector.
Figure 2:
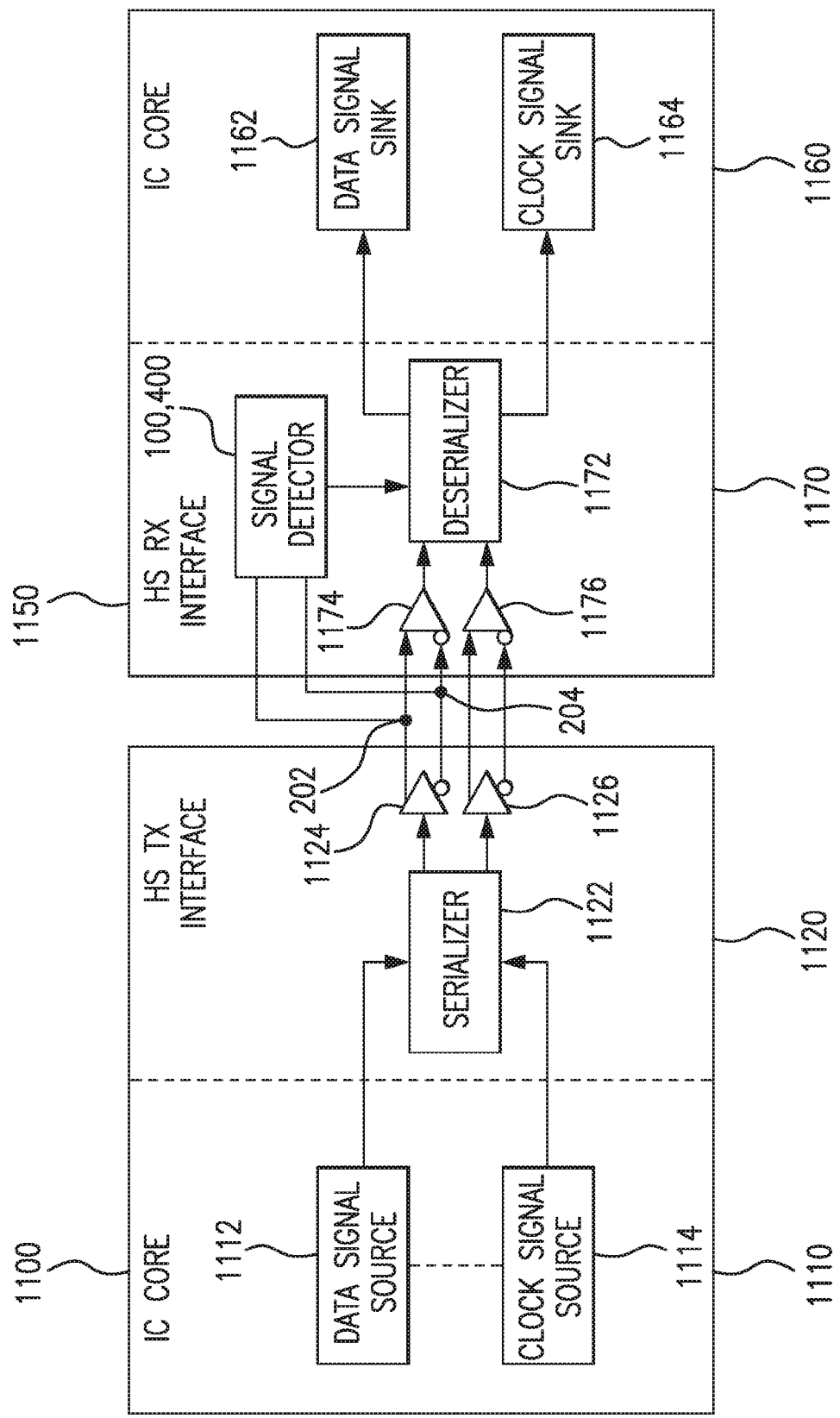
FIG. 2 is a block diagram of a high speed serial communication system employing a signal detector.

Referring to FIGS. 2-6A, there is shown signal detector 400 for detecting differential data signals. As will be described in following paragraphs, signal detector 400 may be employed in conjunction with a deserializer 1172 used in a high speed data communication receiver 1170. Signal detector 400 employs a full wave rectifier 270 for sensing the envelope of the differential signals being transmitted and a reference voltage source 260 having a circuit architecture in common with the full wave rectifier to compensate for temperature and process effects on the full wave rectifier and power supply drifts As a representative example of an application using signal detector 400, FIG. 2 shows two integrated circuit (IC) chips 1100 and 1150 that communicate via a high speed serial interface. This example is but one of many possible applications utilizing a signal detector such as signal detector 400. Elements of transmitting IC 1100 have analogous elements in IC 1150 that perform the reverse function. While the interface is illustrated as occurring between two different ICs, it could also be used for communication within a single IC. Furthermore, the ICs can be of various types, such as programmable logic devices, application-specific integrated circuits, system-on-chip or combinations thereof.

IC 1100 includes an IC core 1110 and a high speed (HS) transmission interface 1120. IC core 1110 contains data signal source 1112 and clock signal source 1114. Data signal source 1112 generates multi-bit bytes, such as 8-bit, 16-bit, 32-bit, etc., to be ultimately transmitted to IC 1150. The clock signal source 1114 generates a clock signal that is associated with the data signal from data signal source 1112. The broken line connecting the data signal source 1112 and the clock signal source 1114 indicates a precise frequency relationship between the output signals of the two modules.

Serializer 1122 converts the multi-bit parallel data from data signal source 1112 into a one-bit data stream that is sent to differential signaling driver 1124. The serializer 1122 also generates a clock signal associated with the newly formed serial data. This clock signal is sent to differential signaling driver 1126. The signaling drivers 1124 and 1126 each convert a single-ended input signal into a differential pair of output signals, which output signals are then sent to the IC 1150.

IC 1150 receives the serial data and associated clock signal from IC 1100. IC 1150 includes a HS receiver interface 1170 and an IC core 1160. The differential data and clock signals are received by differential receivers 1174 and 1176, respectively, which convert the differential pairs to single-ended outputs. The differential data signals are also processed by a signal detector, which previously may have been a conventional signal detector 100, but which is now advantageously replaced by the signal detector 400 more fully disclosed in following paragraphs. The differential data signals are connected to inputs 202 and 204 of the signal detector 400. Signal detector 400 is a full wave rectifier and thus uses an envelope detection signal detection technique to determine whether or not the incoming data is valid. The output of signal detector 400 is coupled to the deserializer 1172.

Deserializer 1172 receives the output of signal detector 400, as well as the single-ended signals generated by receivers 1174 and 1176. If signal detector 400 indicates that data of acceptable integrity is being transmitted, deserializer 1172 will be put into an active mode and will convert the serial data generated by receiver 1174 into a parallel bit stream, relying on the clock signal from receiver 1176 to sample bits at appropriate intervals. The multi-bit data is then sent to data signal sink 1162, and a related clock signal is sent to clock signal sink 1164. Both sinks reside in the IC core 1160.

The transmission of separate data and clock signals described above assumes that source-synchronous operation is possible. However, it is known that HS communication can introduce such a significant skew between the data and clock signals that the clock must be embedded in the serial data itself. In such a case, clock data recovery circuitry would be used to extract the appropriate clock signal at IC 1150.

Figure 3:
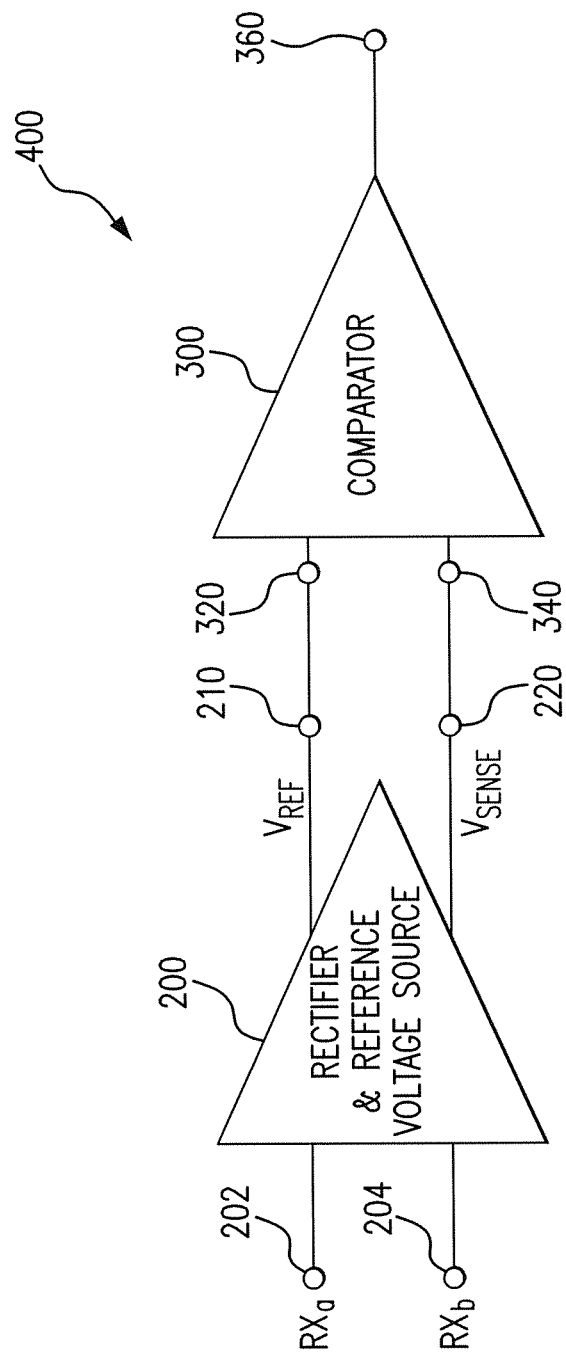
FIG. 3 block diagram of the signal detector of the present invention.

A block diagram of the signal detector 400 is shown in FIG. 3. Signal detector 400 includes a rectifier and reference voltage source 200 having inputs 202 and 204 respectively coupled to the differential data signals $RX_a$ and $RX_b$ from which the output $V_{SENSE}$ is generated at the output 220 and the output $V_{REF}$ is generated at the output 210. The outputs 210 and 220 of rectifier and reference voltage source 200 are respectively coupled to the inputs 320 and 340 of comparator 300 to supply the $V_{REF}$ and $V_{SENSE}$ signals thereto for comparison. The output 360 of comparator 300 is a data detection signal that indicates receipt of valid incoming data when the magnitude of the $V_{SENSE}$ signal exceeds the magnitude of the $V_{REF}$ signal. Comparator 300, unlike that required in prior art systems, does not require high speed operation. The full wave rectifier 270 and reference voltage source 260 respectively output a $V_{SENSE}$ signal and a $V_{REF}$ signal that are averaged by respective RC filters, as will be described herein. The signals therefore do not change very fast, and thus the need for a relatively high speed comparator is reduced. As an example, for received data having a data rate of 16 GB/sec, the comparator's measurement window would be on the order of 2 to 16 nanoseconds. The lower speed requirement for comparator 300 also equates to a comparator that utilizes less power than that required by the high speed comparators of prior art systems.

Figure 4:
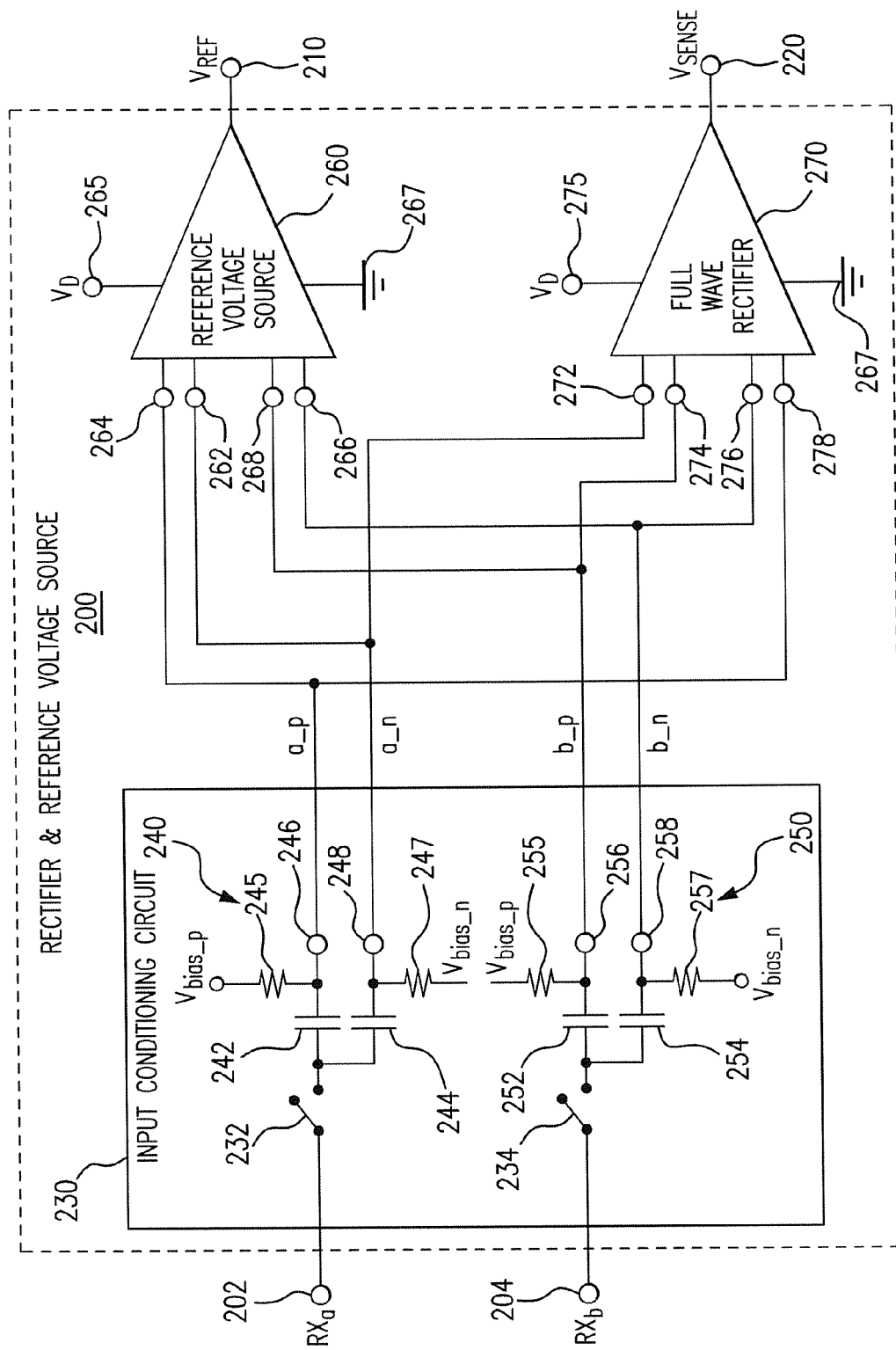
FIG. 4 is a block diagram of the Rectifier and Reference Voltage Source portion of the signal detector shown in FIG. 3.

Turning now to FIG. 4, the rectifier and voltage reference source 200 is shown to include an input conditioning circuit 230, a voltage reference source 260 and a full wave rectifier 270. Input conditioning circuit 230 receives the differential data signals $RX_a$ and $RX_b$ at the respective inputs 202 and 204 and AC couples (high pass filter) those signals to the voltage reference source 260 and the full wave rectifier 270 through biasing circuits 240 and 250. The input 202 is coupled through a normally closed switch 232 to a pair of coupling capacitors 242 and 244. Similarly input 204 is coupled through a normally closed switch 234 to a pair of coupling capacitors 252 and 254. Switches 232 and 234, which may be semiconductor devices, are used during calibration operations for the voltage reference source 260 and the full wave rectifier 270, at which times they are opened.

As will be described forthcoming paragraphs, the voltage reference source 260 and the full wave rectifier 270 have a common circuit architecture, each utilizing pairs of semiconductor devices of opposing conductivity type with corresponding source terminals connected together. The input conditioning circuit 230, therefore, receives the $RX_a$ and $RX_b$ signals from terminals 202 and 204 and respectively provides each to one of the biasing circuits 240 and 250. Biasing circuits 240 and 250 provide the input signals biased for respective input to both of the opposing conductivity type devices of the voltage reference source 260 and the full wave rectifier 270. Biasing circuit 240 includes voltage sources $V_{bias\_p}$ and $V_{bias\_n}$ and current limiting resistors 245 and 247 respectively coupled thereto, and biasing circuit 250 includes voltage sources $V_{bias\_p}$ and $V_{bias\_n}$ and current limiting resistors 255 and 257 respectively coupled to voltage sources $V_{bias\_p}$ and $V_{bias\_n}$. Hence, the $RX_a$ signal is coupled through the AC coupling capacitor 242 to the terminal 246 and biased by the voltage $V_{bias\_p}$ through the current limiting resistor 245 for input as the a_p signal to P-type devices. The $RX_a$ signal is also coupled through an AC coupling capacitor 244 to the terminal 248 and biased by the voltage $V_{bias\_n}$ through the corresponding current limiting resistor 247 for input as the a_n signal to N-type devices. Likewise, the $RX_b$ signal is coupled through an AC coupling capacitor 252 to the terminal 256 and biased by the voltage $V_{bias\_p}$ through the current limiting resistor 255 for input as the b_p signal to P-type devices. The $RX_b$ signal is also coupled through an AC coupling capacitor 254 to the terminal 258 and biased by the voltage $V_{bias\_n}$ through the corresponding current limiting resistor 257 for input as the b_n signal to N-type devices. Each of the $RX_a$ and $RX_b$ signals are respectively coupled to the corresponding capacitors 242, 244 and 252, 254 through normally closed switches 232 and 234. Switches 232 and 234 are opened during calibration of the full wave rectifier circuit 270 and the reference voltage source 260. Although not important to the inventive concepts being disclosed herein, the schematic representation of switches 232 and 234 is not intended to be limiting. The switches 232 and 234 may be implemented by semiconductor devices.

The voltage reference source 260 is coupled to the power supply voltage $V_D$ at terminal 265 and power supply reference voltage at terminal 267, which is a ground reference voltage. The full wave rectifier 270 is also coupled to the power supply voltage $V_D$ at terminal 275 and power supply reference voltage at terminal 267. The a_p signal, which is the P biased $RX_a$ signal, at terminal 246 is coupled to the input terminal 264 of the reference voltage source 260 and the input terminal 278 of the full wave rectifier 270. The a_n signal, which is the N biased $RX_a$ signal, at terminal 248 is coupled to the input terminal 262 of the reference voltage source 260 and the input terminal 272 of the full wave rectifier 270. The b_p signal, which is the P biased $RX_b$ signal, at terminal 256 is coupled to the input terminal 268 of the reference voltage source 260 and the input terminal 274 of the full wave rectifier 270. The b_n signal, which is the N biased $RX_b$ signal, at terminal 258 is coupled to the input terminal 266 of the reference voltage source 260 and the input terminal 276 of the full wave rectifier 270.

Figure 5:
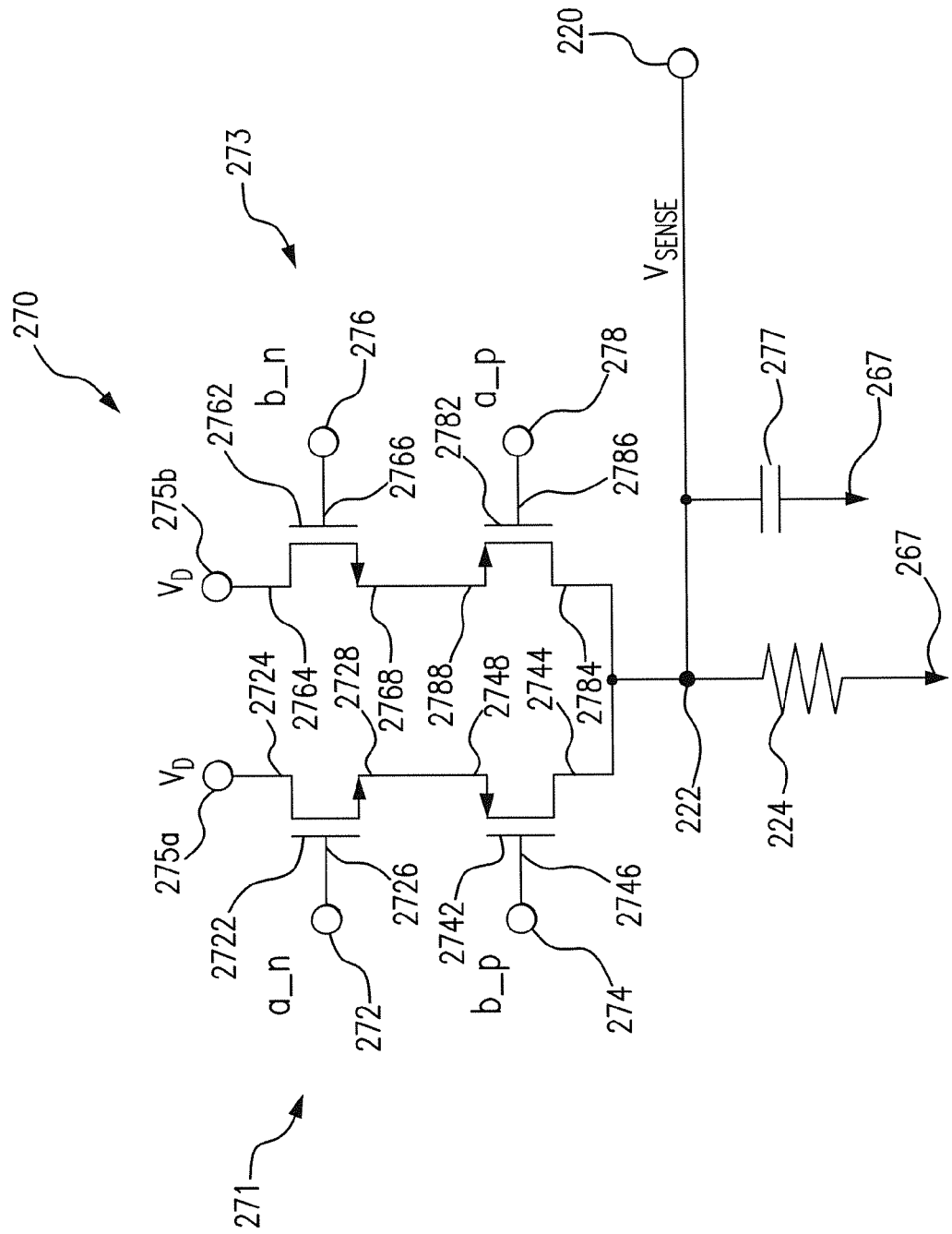
FIG. 5 is a schematic diagram of the full wave rectifier shown in FIG. 4.

With reference to the schematic circuit diagram in FIG. 5, the circuit arrangement and operation of the full wave rectifier 270 will now be described. Full wave rectifier 270 includes a first differential input circuit 271 and a second differential input circuit 273, each being coupled to the output node 222. The first differential input circuit 271 includes a pair of field effect transistors (FETs) 2722 and 2742 of different conductivity type having respective gate terminals 2726 and 2746, each being connected to a corresponding differential input terminal 272, 274. FET 2722 is an N channel field effect transistor having a drain terminal 2724 connected to the power supply input terminal 275a for input of the supply voltage $V_D$, and a source terminal 2728 coupled to the source terminal 2748 of the FET 2742. FET 2742 is a P channel field effect transistor having a drain terminal 2744 connected to the output node 222. As the source terminals 2728 and 2748 of FETs 2722 and 2742 are connected together, a common current flows through the FETs 2722 and 2742 to the output node 222.

Output node 222 is coupled to a load resistance 274 that may be formed by one or more resistors. Load resistance 224 is connected between output node 222 and the power supply reference voltage terminal 267, which is ground potential in this exemplary embodiment. In place of the load resistance 224, a current mirror circuit may be employed. Output node 222 is connected to the $V_{SENSE}$ signal output terminal 220. Output node 222 is also connected to a smoothing capacitor 277 that averages the $V_{SENSE}$ signal provided to output terminal 220.

Similarly, the second differential input circuit 273 includes a pair of field effect transistors (FETs) 2762 and 2782 of different conductivity type having respective gate terminals 2766 and 2786, each being connected to a corresponding differential input terminal 276, 278. FET 2762 is an N channel field effect transistor having a drain terminal 2764 connected to the power supply input terminal 275b for input of the supply voltage $V_D$, and a source terminal 2768 coupled to the source terminal 2788 of the FET 2782. Although, the first differential input circuit 271 and the second differential input circuit 273 are shown as being connected to a common power supply voltage $V_D$, the voltages supplied to the power supply input terminals 275a and 275b may be different to account for device differences or achieve other design objectives. FET 2782 is a P channel field effect transistor having a drain terminal 2784 connected to the output node 222. As the source terminals 2768 and 2788 of FETs 2762 and 2782 are connected together, a common current flows through the FETs 2762 and 2782 to the output node 222 where it is combined with the current flowing through the FETs 2722 and 2742. While the conductivity types of FETs 2722 and 2742, and FETs 2762 and 2782 have been particularly described in this exemplary embodiment, it should be understood that the conductivity types of FETs 2722 and 2742, and FETs 2762 and 2782 may be interchanged along with the polarity of the power supply voltages supplied thereto.

The operation of full wave rectifier 270 takes advantage of the nonlinearity in the gain of the FETs that form the first differential input circuit 271 and the second differential input circuit 273. Depending on the biasing of the FETs, there will be either an exponential response, when biased for subthreshold operation, or a quadratic response, when biased for operation above the threshold. Although operation with either response will function in full wave rectifier 270, the exponential response obtained by biasing the FETs for subthreshold operation provides a greater rectification efficiency.

To understand the operation of full wave rectifier 270, first consider the operation of first differential input circuit 271. With no input signals being received at the input terminals 202 and 204 (FIG. 4), the FET 2722 and the FET 2742 are biased for passing a nominal current to the output node 222. As the two devices 2722 and 2742 are in series, they pass the same current and as the sources of those two devices are connected together the gate to source voltage ($V_{GS}$) of each floats to a level that provides the nominal current that passes commonly therethrough. Now, consider the effect of a positive common mode voltage signal appearing at the differential line input terminals 202, 204. The a_n and b_p inputs to the control gates 2726 and 2746 of FETs 2722 and 2742 will each increase. The increased positive voltage input to the N channel device 2722 would raise the $V_{GS}$ and the device, in response, would pass more current. However, the voltage input to the P channel device 2742 also increases, and that would lower its $V_{GS}$ and therefore reduce the current flow through that device. Since FETs 2722 and 2742 must pass the same current, any change in the $V_{is}$ of each device is nullified and the current remains substantially unchanged. In the presence of a negative common mode voltage signal appearing at the differential line input terminals 202, 204, the P channel device 2742 would be have a $V_{GS}$ tending to result in an increase in current, while the N channel device 2722 would be have a $V_{GS}$ tending to result in a decrease in current. Here again, the $V_{GS}$ of the devices floats to values that substantially maintain the current supplied to output node 222 unchanged. Thus, the circuit provides inherent common mode rejection. In practice, there is a time lag for the $V_{GS}$ to settle under these conditions, but it is minimal. To the extent that the $V_{SENSE}$ signal changes, it decrease, as the device that is driven to reduce the current couple to the output node 222 acts as a limiting element.

Consider now the input of a differential voltage signal that represents a logic 1 appearing at the differential line input terminals 202, 204. In this situation the a_n input to the gate 2726 of FET 2722 will increase in magnitude in a positive direction and the b_p input to the gate 2746 of FET 2742 will increase in magnitude negatively. Thus, the $V_{GS}$ of each device will change in a manner that results in an increase in the current flow to the output node 222 and thereby through the load resistance 224 to generate an increased $V_{SENSE}$ signal at the output terminal 220. When the differential voltage signal represents a logic 0, the a_n and b_p inputs to the gates 2726 and 2746 of FETs 2722 and 2742 will each decrease in magnitude, resulting in the respective $V_{GS}$ of each device changing in a manner to reduce the current flow to the output node 222. Due to the nonlinearity of FETs 2722 and 2742, the response to the differential signal representing a logic 0 is much less than the response to a differential signal representing a logic 1. Thus, the increase in current in response to a logic 1 is significantly greater than the reduction in current in response to the logic 0, and the first differential input circuit 271 thereby defines one half wave portion of full wave rectifier 270.

Looking now at the second differential input circuit 273, such similarly includes an N channel FET 2762 coupled in series with a P channel FET 2782, with the source 2768 of FET 2762 being connected to the source 2788 of FET 2782. The drain 2764 of FET 2762 is connected to the power supply input terminal 275b for input of the supply voltage $V_D$, and the drain 2784 of FET 2782 is connected to the output node 222. Consequently, the current from the second differential input circuit is additive with the current from the first differential input circuit at output node 222 to pass through the loads resistance 224, and the summation of the currents pass through load resistance 224 to establish the $V_{SENSE}$ signal. The gate 2766 of the N channel FET 2762, through the input terminal 276 receives the biased input signal b_n, which corresponds to the differential input signal of opposite polarity to the signal a_n that is input to the N channel FET 2722 of the first differential input circuit 271. Correspondingly, the gate 2786 of the P channel FET 2782, through the input terminal 278 receives the biased input signal a_p, which corresponds to the differential input signal of opposite polarity to the signal b_p that is input to the P channel FET 2742 of the first differential input circuit 271.

In operation, the second differential input circuit 273 similarly responds to common mode signals as described for the first differential input circuit 271. Thus, even though the output of first and second differential input circuits 271 and 273 are additive, the effect of common mode input signals on the $V_{SENSE}$ output signal is insignificant. As an example, in one working embodiment, a 300 millivolt to peak common mode signal produced a 2 millivolt response from the full wave rectifier. Hence, full wave rectifier 270 provides high common mode immunity.

With respect to operation with differential input signals, the second differential input circuit 273, responds oppositely with respect to differential signals representing logic 1s and 0s compared to that of the first differential input circuit 271.

When the differential voltage signal represents a logic 0, the a_n and b_p inputs to the gates 2726 and 2746 of FETs 2722 and 2742 will each increase in magnitude, increasing positively for the N channel device and negatively for the P channel device. Accordingly, the respective $V_{GS}$ of each device 2762 and 2782 changes in a manner to increase the current flow to the output node 222. That is in contrast to the current flow from the first differential input circuit 271 in response to a logic zero input where the current is reduced. The increase in current supplied from the second differential input circuit 273 more than overcomes the reduction in current from the first differential input circuit 271 due to the square law behavior of FETs. Hence, the net effect on the current flowing through output resistance 224 will be an increase in current and produces an increase in the $V_{SENSE}$ signal at the output terminal 220.

Due to the differential voltage signals input to the N and P channel FETs of the second differential input circuit 273 being interposed with respect to the corresponding N and P channel FETs of the second differential input circuit 271, the response of the second differential input circuit 271 to differential signals representing a logic 1 input results a decrease in current supplied to the output node 222 by the second differential input circuit 273. When the differential voltage signal represents a logic 1, the b_n and a_p inputs to the gates 2766 and 2786 of FETs 2762 and 2782 will each decrease in magnitude, resulting in the respective $V_{GS}$ of each device changing in a manner to reduce the current flow to the output node 222 and thereby operating as a half wave rectifier. As discussed above, under this differential voltage signal input condition, the first differential input circuit 271 provides an increase in current to output node 222. Again due to the square law behavior of the devices, the increase in current from the first differential input circuit 271 is significantly greater than the reduction in current from the second differential input circuit 273 and the net effect on the current flowing through output resistance 224 will be an increase in current and thereby produces an increase in the $V_{SENSE}$ signal at the output terminal 220. Therefore, full wave rectifier 270 is able to detect both the high and low envelopes of the input differential voltage signals with high common mode rejection, and output an increase in magnitude of the $V_{SENSE}$ signal at the output terminal 220 as a response to receipt of differential data signals.

Figure 5A:
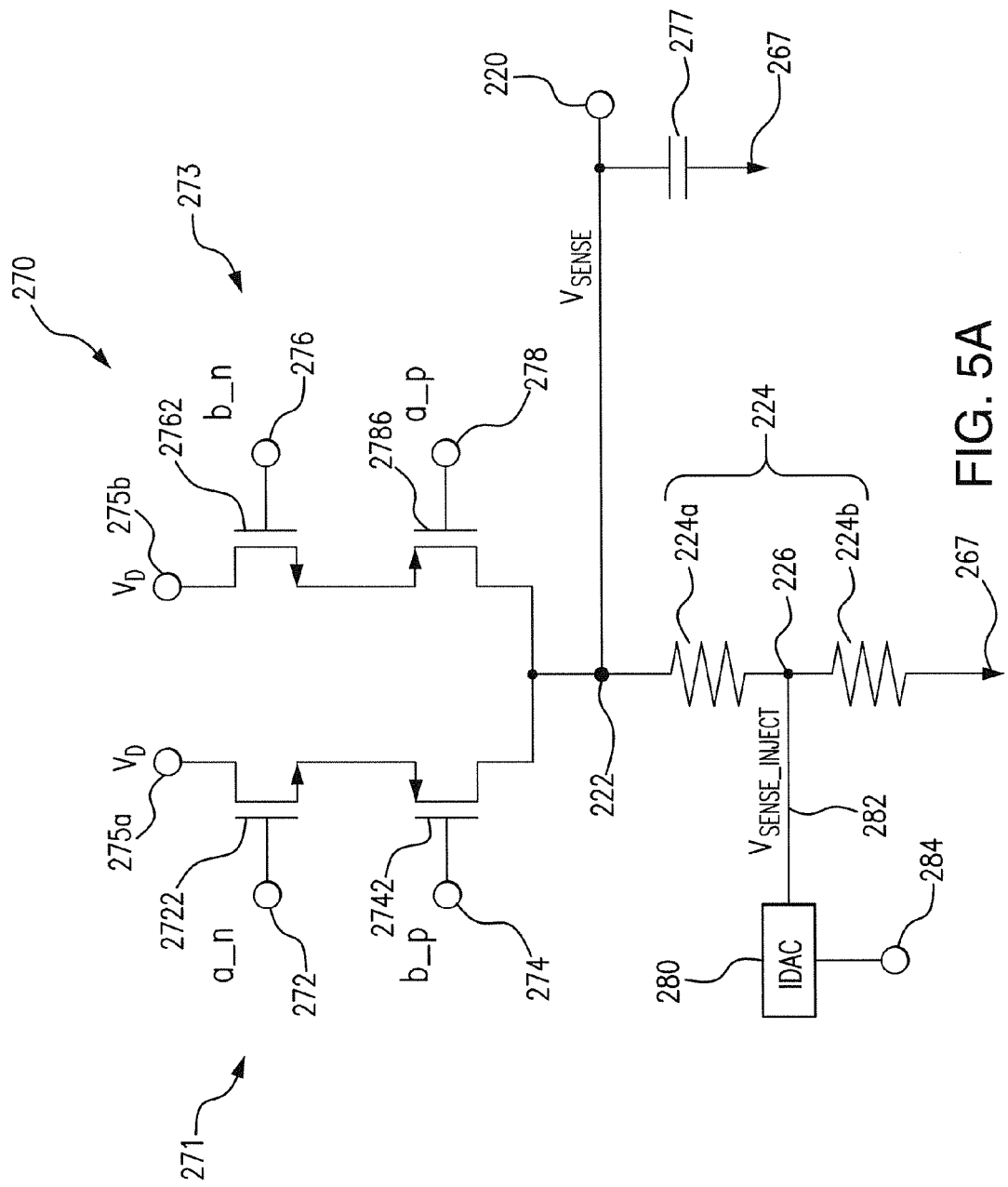
FIG. 5A is a schematic diagram of the full wave rectifier shown in FIG. 4 with added calibration circuit.

In FIG. 5A, full wave rectifier 270 is shown with an adaption that provides for trimming and calibration of the circuit. A trimming or calibration operation compensates for variations in circuit components due to manufacturing variability. The provision for adjusting the base line of the $V_{SENSE}$ signal is provided by dividing the load resistance 224 into two series coupled resistors 224a and 224b and injecting a current signal ($V_{SENSE\_INJECT}$) into the node 226 therebetween. The injected current combines with the current flowing through the resister 224a to flow through the resistor 224b. The added injected current flowing through resistor 224b adds an offset voltage to the $V_{SENSE}$ signal that is output to the output terminal 220.

The injected $V_{SENSE\_INJECT}$ current signal may be provided from any current source, and a current digital to analog converter (IDAC) is one such source that provides a precisely adjustable source of current that can be conveniently provided. As shown, the IDAC 280 outputs the $V_{SENSE\_INJECT}$ current signal on line 282 to the node 226 between resistors 224a and 224b. A digital signal defining the current value being injected is provide to the input terminal 284, which may represent a serial or parallel input. IDAC 280 is used to inject a current for generating an offset voltage to compensate for offsets that result from variations in the manufacturing process. The digital input to IDAC 280 can be manually set and incremented or such can be easily performed by a processor.

Figure 6:
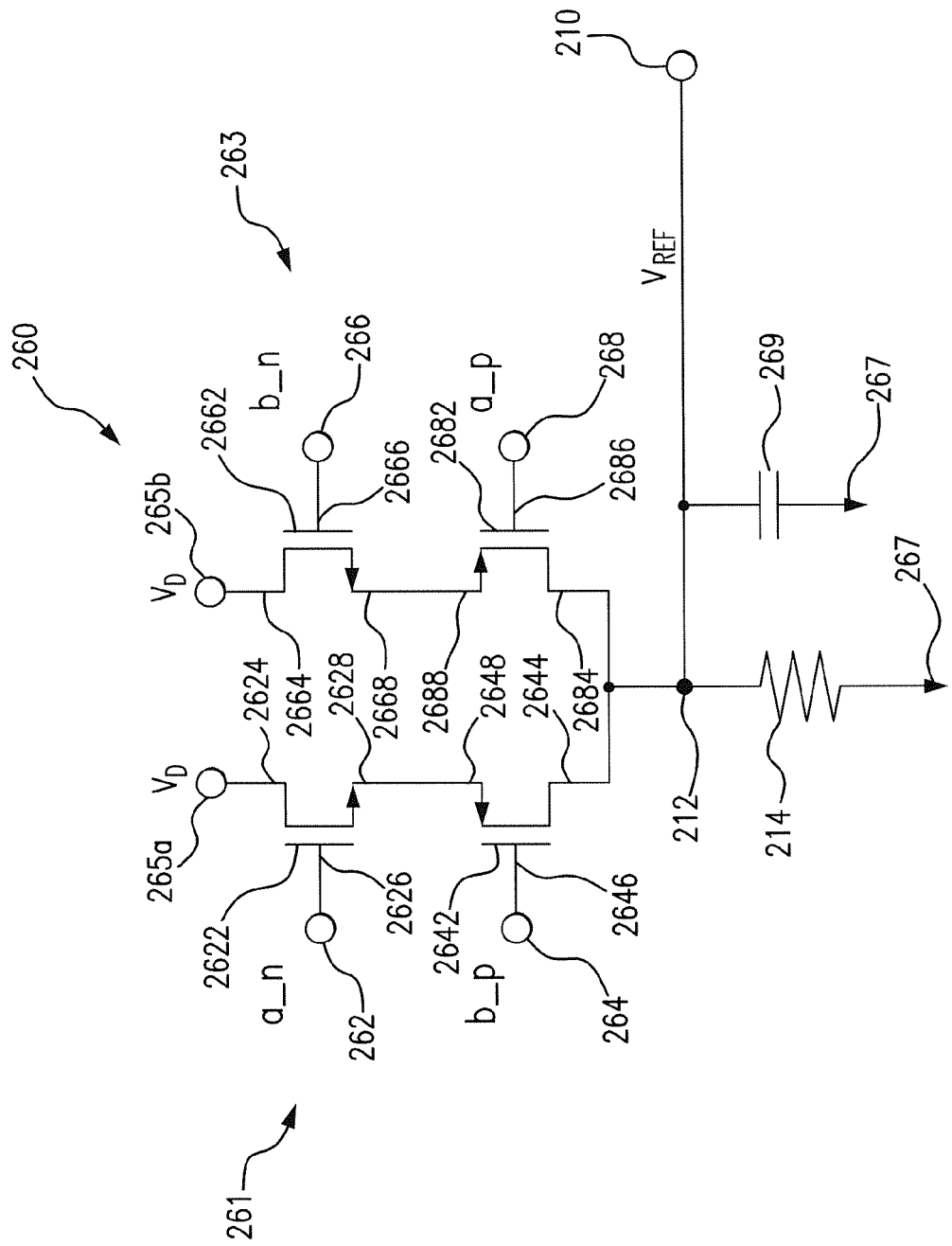
FIG. 6 is a schematic diagram of the reference voltage source shown in FIG. 4.

Referring now to FIG. 6, there is shown reference voltage source 260 having inputs coupled to the differential data signal lines through the input conditioning circuit 230 (shown in FIG. 4). As is apparent to those skilled in the art, reference voltage source 260 has a circuit configuration in common with that of full wave rectifier 270. This arrangement has particular advantages in the operation of signal detector 400. When produced on a single semiconductor substrate, the components of reference voltage source 260 are subject to the same process variations as that of the components of full wave rectifier 270 and with the circuits having a common architecture, the reference voltage output will track drift due to the process and temperature, and track power supply drift to provide compensation for those variations. As reference voltage source 260 is coupled to the differential data signal lines and in effect only sees common mode voltages, the reference voltage source 260 will also track the full wave rectifier's response to common mode input voltages.

Reference voltage source 260 includes a first input circuit 261 and a second input circuit 263, each being coupled to the output node 212. The first input circuit 261 includes a pair of FETs 2622 and 2642 of different conductivity type having respective gate terminals 2626 and 2646, each being connected to a corresponding input terminal 262, 264. FET 2622 is an N channel field effect transistor having a drain terminal 2624 connected to the power supply input terminal 275b for input of the supply voltage $V_D$, and a source terminal 2628 coupled to the source terminal 2648 of the FET 2642. FET 2642 is a P channel field effect transistor having a drain terminal 2644 connected to the output node 212. As the source terminals 2628 and 2648 of FETs 2622 and 2642 are connected together, a common current flows through the FETs 2622 and 2642 to the output node 212.

Output node 212 is coupled to a load resistance 214 that may be formed by one or more resistors. Load resistance 214 is connected between output node 212 and the power supply reference voltage terminal 267, which is ground potential in this exemplary embodiment. In place of the load resistance 214, a current mirror circuit may be employed. Output node 212 is connected to the $V_{REF}$ output terminal 210 and is also connected to a smoothing capacitor 269 that averages the $V_{REF}$ signal provided to output terminal 210.

Similarly, the second input circuit 263 includes a pair of field effect transistors (FETs) 2662 and 2682 of different conductivity type having respective gate terminals 2666 and 2686, each being connected to a corresponding input terminal 266, 268. FET 2662 is an N channel field effect transistor having a drain terminal 2664 connected to the power supply input terminal 275b for input of the supply voltage $V_D$, and a source terminal 2668 coupled to the source terminal 2688 of the FET 2682. FET 2682 is a P channel field effect transistor having a drain terminal 2684 connected to the output node 212. The source terminals 2668 and 2688 of FETs 2662 and 2682 being connected together results in a common current flowing through the FETs 2662 and 2682 to the output node 212, where it is combined with the current flowing through the FETs 2622 and 2642. While the conductivity types of FETs 2622 and 2642, and FETs 2662 and 2682 have been particularly described in this exemplary embodiment, it should be understood that the conductivity types of FETs 2622 and 2642, and FETs 2662 and 2682 may be interchanged along with the polarity of the power supply voltages supplied thereto.

Referring additionally to FIG. 4, it can be seen that input terminals 262 and 264 each receive the same signal, although biased appropriately for the conductivity type of FETs 2622 and 2642 to which they are input. Input terminal 262 receives the input a_n, which is the $RX_a$ signal biased for an N channel device, and input terminal 264 receives the input a_p, which is the $RX_a$ signal biased for a P channel device. Thus, all changes in that which is the $RX_a$ signal are applied to both FETs 2622 and 2642. Likewise, input terminals 266 and 268 each receive the same signal, although biased appropriately for the conductivity type of FETs 2662 and 2682 to which they are input. Input terminal 266 receives the input b_n, which is the $RX_b$ signal biased for an N channel device, and input terminal 268 receives the input b_p, which is the $RX_b$ signal biased for a P channel device. Thus, all changes in that which is the $RX_b$ signal are applied to both FETs 2662 and 2682. The current from each of the first and second input circuits are coupled to the output node 212 and the combined current flows through the load resistance 214 to produce the reference voltage ($V_{REF}$) at the output terminal 210.

In operation, any time the $RX_a$ signal changes, the voltage applied to the gate terminals 2626 and 2646 of respective FETs 2622 and 2642 will change accordingly. In response to a logic 1 or positive common mode voltage, the $V_{GS}$ voltage of the N channel device would tend to increase and the $V_{GS}$ voltage of the P channel device would tend to decrease, and vice versa for a logic 0 or negative common mode voltage. Since a common current must flow through FETs 2622 and 2642, any change in the $V_{GS}$ of each device is nullified and the current remains substantially unchanged. As in the full wave rectifier 270, the $V_{GS}$ for each device will float to substantially maintain the current supplied to output node 212 unchanged. Here to, the result of any time lag for the $V_{GS}$ to settle under these conditions is minimal, being analogous to that of full wave rectifier 270.

The response of the second input circuit 263 mirrors that of the first input circuit 261. Any time the $RX_b$ signal changes, the voltage applied to the gate terminals 2666 and 2686 of respective FETs 2662 and 2682 will change accordingly. In response to a negative common mode voltage or a logic 1 differential signal ($RX_b$ being "low"), the $V_{GS}$ voltage of the N channel device would tend to decrease and the $V_{GS}$ voltage of the P channel device would tend to increase, and vice versa for a logic 0 differential signal or positive common mode voltage. Since a common current must flow through FETs 2662 and 2682, any change in the $V_{GS}$ of each device is nullified and the current remains substantially unchanged. Here again, as in the full wave rectifier 270, the $V_{GS}$ for each device would float to substantially maintain the current supplied to output node 212 unchanged. As in the first input circuit 261, the result of any time lag for the $V_{GS}$ to settle under these conditions is minimal.

Figure 6A:
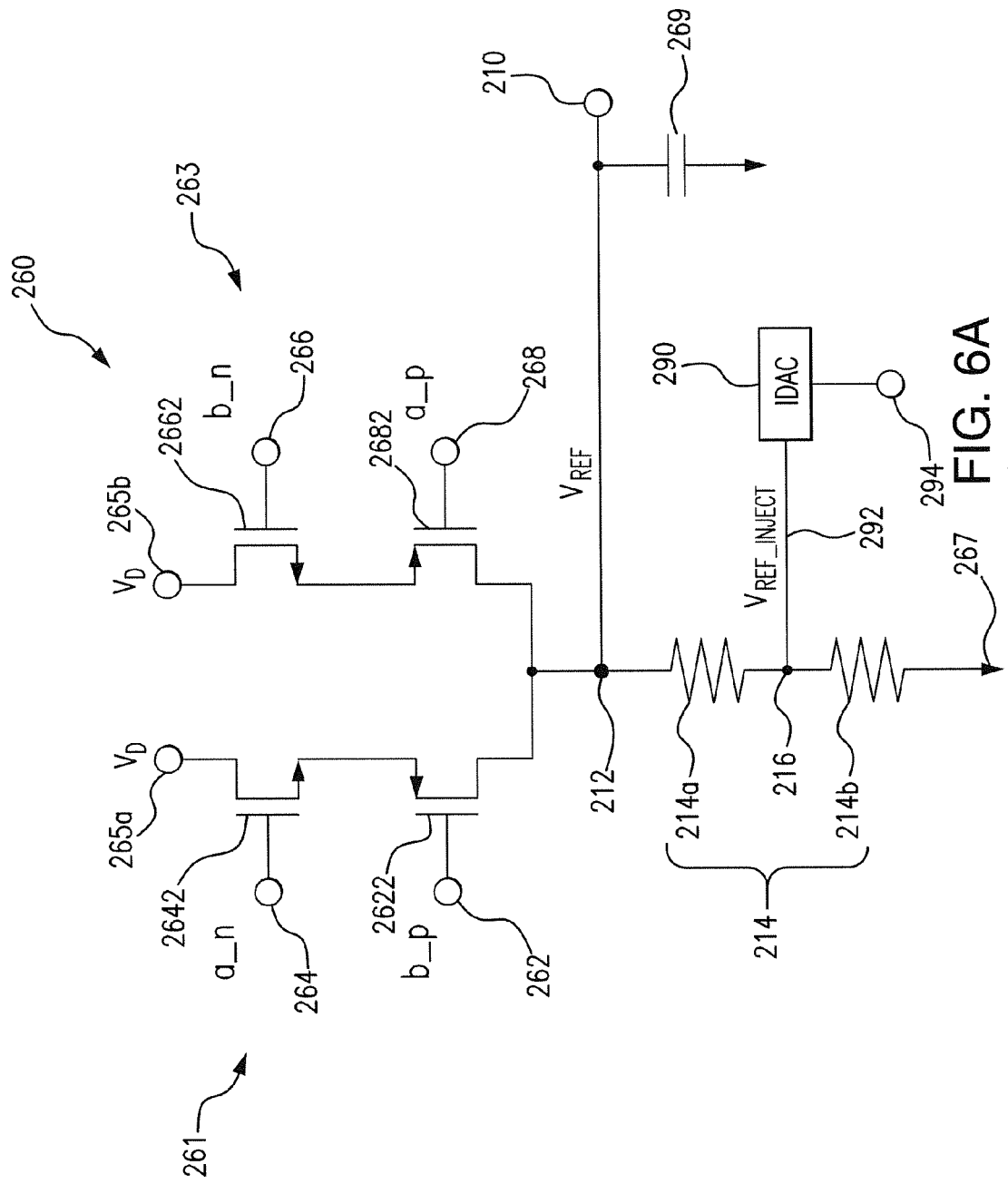
FIG. 6A is a schematic diagram of the reference voltage source shown in FIG. 4 with added calibration circuit.

In FIG. 6A, reference voltage source 260 is shown with an adaption like that employed in the full wave rectifier 270, providing trimming and calibration of the circuit. Since both the full wave rectifier 270 and the voltage reference source 260 are intended to have a common architecture, then the adaption to the full wave rectifier 270 shown in FIG. 5A is similarly applied to the voltage reference source 260, as shown. Hereto, the trimming or calibration operation compensates for variations in circuit components due to manufacturing process variations and permits the addition of an offset voltage to the reference voltage to ensure that the $V_{SENSE}$ signal represents an actual signal and not noise. The provision for adjusting the base line of the $V_{REF}$ signal is provided by dividing the load resistance 214 into two series coupled resistors 214a and 214b and injecting a current signal ($V_{REF\_INJECT}$) into the node 216 therebetween. The injected current combines with the current flowing through the resister 214a to flow through the resistor 214b. The added injected current flowing through resistor 214b biases the $V_{REF}$ signal output to the output terminal 210.

The injected $V_{REF\_INJECT}$ current signal may be provided from any current source, and a current digital to analog converter (IDAC) is one such source that provides a precisely adjustable source of current that can be conveniently provided. As shown, the IDAC 290 outputs the $V_{REF\_INJECT}$ current signal on line 292 to the node 216 between resistors 214a and 214b. A digital signal defining the current value being injected is provided to the input terminal 294, which may represent a serial or parallel input. In determining the appropriate magnitude of the $V_{REF\_INJECT}$ current signal, the switches 232 and 234 (FIG. 4) are opened and the IDAC 290 is used to inject a current for generating an offset voltage. The digital input to IDAC 290 could be manually set and incremented, however, a processor can more easily perform the calibration procedure. The $V_{REF\_INJECT}$ current signal is incrementally increased while monitoring the $V_{SENSE}$ and $V_{REF}$ voltages until the comparator 300 changes state, then an additional offset voltage, for example 30 millivolts, is added by increasing the $V_{REF\_INJECT}$ current signal. In this manner, the $V_{SENSE}$ voltage output at output terminal 220 must exceed the added offset voltage defined by the $V_{REF}$ voltage output, at output terminal 210, to generate a data detection signal at the output terminal 360 of the comparator 300 (FIG. 3) and ensure that an input signal rather than noise is actually being detected.

The descriptions above are intended to illustrate possible implementations of the present invention and are not restrictive. While this invention has been described in connection with specific forms and embodiments thereof, it will be appreciated that various modifications other than those discussed above may be resorted to without departing from the spirit or scope of the invention. Such variations, modifications, and alternatives will become apparent to the skilled artisan upon review of the disclosure. For example, functionally equivalent elements or method steps may be substituted for those specifically shown and described, and certain features may be used independently of other features, and in certain cases, particular locations of elements or sequence of method steps may be reversed or interposed, all without departing from the spirit or scope of the invention as defined in the appended Claims. The scope of the invention should therefore be determined with reference to the description above and the appended claims, along with their full range of equivalents.

What is claimed is:

1. A full-wave rectifier circuit for detection of differential input signals and common mode signal rejection, comprising:
   a first differential input circuit having a pair of first field effect transistors (FETs) of different conductivity type, each first FET having a control gate coupled to a respective differential input, one of said pair of first FETs having a drain coupled to an output node; and
   a second differential input circuit having a pair of second FETs of different conductivity type, each second FET having a control gate coupled to one of the differential inputs corresponding to the differential input coupled to said control gate of one of said first FETs of opposite conductivity type, one of said pair of second FETs having a drain coupled to said output node;

where said pair of first FETs are coupled together for passing a first signal current therethrough responsive to a differential signal of a first polarity being input to said control gates of said pair of first FETs and said pair of second FETs are coupled together for passing a second signal current therethrough responsive to a differential signal of a second polarity being input to said control gates of said pair of second FETs.

2. The full-wave rectifier circuit as recited in claim 1, where said pair of first FETs have respective source terminals thereof connected together and said pair of second FETs have respective source terminals thereof connected together.

3. The full-wave rectifier circuit as recited in claim 2, further comprising a load resistance coupled to said output node; said first and second signal currents additively flow through said load resistance to establish a sensing signal voltage at said output node.

4. The full-wave rectifier circuit as recited in claim 3, where said load resistance includes a sensing resistor coupled between said output node and a current injection node, and a calibration resistor coupled between said current injection node and a reference potential.

5. The full-wave rectifier circuit as recited in claim 4, where said current injection node is coupled to a current source for generating a voltage across said calibration resistor to add an offset voltage to said sensing signal voltage at said output node.

6. The full-wave rectifier circuit as recited in claim 4, where said current source is a current digital to analog converter.

7. The full-wave rectifier circuit as recited in claim 1, where said one of said pair of first FETs having said drain coupled to said output node is a P-type FET and the other of said pair of first FETs is an N-type FET.

8. The full-wave rectifier circuit as recited in claim 7, where said one of said pair of second FETs having said drain coupled to said output node is a P-type FET and the other of said pair of second FETs is an N-type FET.

9. The full-wave rectifier circuit as recited in claim 1, where said one of said pair of second FETs having said drain coupled to said output node is a P-type FET and the other of said pair of second FETs is an N-type FET; and where said differential inputs are respectively coupled to said control gates of said pairs of first and second FETs through corresponding biasing circuits to bias each differential input signal for coupling to different conductivity type FETs.

10. The full-wave rectifier circuit as recited in claim 1, where said differential inputs are respectively coupled to said control gates of said pairs of first and second FETs through corresponding biasing circuits to bias each differential input signal for respective coupling to said different conductivity type FETs.

11. A differential input signal detector, comprising:
a pair of differential inputs;
a full wave rectifier having a first differential input circuit coupled to said pair of differential inputs for detecting a differential signal of a first polarity, a second differential input circuit coupled to said pair of differential inputs for detecting a differential signal of a second polarity and an output node coupled to both said first differential input circuit and said second differential input circuit, said full wave rectifier generating a signal at said output node responsive to input of either said differential input signal of said first polarity or said differential input signal of said second polarity;
a reference voltage circuit having a first common mode input circuit coupled to a first of said pair of differential inputs, a second common mode input circuit coupled to a second of said pair of differential inputs and a reference output node coupled to both said first common mode input circuit and said second common mode input circuit, said reference voltage circuit generating a reference voltage at said reference output node thereof having compensation for common mode effects; and
a comparator having a first input couple to said output node of said full wave rectifier and a second input coupled to said reference output node of said reference voltage circuit, said comparator generating an output signal indicative of a differential input signal being detected responsive to a voltage of said signal at said output node of said full wave rectifier being greater than said reference voltage at said reference output node.

12. The differential input signal detector as recited in claim 11, where said first differential input circuit includes a pair of rectifier first field effect transistors (FETs) of different conductivity type, each rectifier first FET having a control gate coupled to a respective one of said pair of differential inputs, one of said pair of rectifier first FETs having a drain coupled to said output node for output of a first signal current responsive to said differential signal of said first polarity being input to said control gates of said pair of rectifier first FETs.

13. The differential input signal detector as recited in claim 12, where said second differential input circuit includes a pair of rectifier second FETs of different conductivity type, each rectifier second FET having a control gate coupled to a respective one of said pair of differential inputs, one of said pair of rectifier second FETs having a drain coupled to said output node for output of a second signal current responsive to said differential signal of said second polarity being input to said control gates of said pair of rectifier second FETs.

14. The differential input signal detector as recited in claim 13, further comprising a first load resistance coupled to said output node; said first and second signal currents additively flow through said first load resistance to establish a sensing signal voltage at said output node.

15. The differential input signal detector as recited in claim 13 where said pair of rectifier first FETs have respective source terminals thereof connected together, and said pair of rectifier second FETs have respective source terminals thereof connected together.

16. The differential input signal detector as recited in claim 11, where said first differential input circuit includes a pair of rectifier first FETs of different conductivity type with respective source terminals thereof being connected together, each rectifier first FET having a control gate coupled to a respective one of said pair of differential inputs, one of said pair of rectifier first FETs having a drain coupled to said output node; and said second differential input circuit includes a pair of rectifier second FETs of different conductivity type with respective source terminals thereof being connected together, each rectifier second FET having a control gate coupled to a respective one of said pair of differential inputs, one of said pair of rectifier second FETs having a drain coupled to said output node.

17. The differential input signal detector as recited in claim 11, where said first common mode input circuit includes a pair of first FETs of different conductivity type with respective source terminals being connected together, each first FET having a control gate coupled to a first of said pair of differential inputs, one of said pair of first FETs having a drain coupled to said reference output node.

18. The differential input signal detector as recited in claim 17, where said second common mode input circuit includes a pair of second FETs of different conductivity type with respective source terminals being connected together, each second FET having a control gate coupled to a second of said pair of differential inputs, one of said pair of second FETs having a drain coupled to said reference output node.

19. The differential input signal detector as recited in claim 18, further comprising a second load resistance coupled to said reference output node; currents respectively flowing through said pairs of first and second FETs additively flow through said second load resistance to establish said reference voltage at said reference output node.

20. The differential input signal detector as recited in claim 13, where said differential inputs are respectively coupled to said control gates of said pairs of rectifier first and rectifier second FETs through corresponding biasing circuits to bias each differential input signal for respective coupling to said different conductivity type FETs.

21. The differential input signal detector as recited in claim 18, where said differential inputs are respectively coupled to said control gates of said pairs of first and second FETs through corresponding biasing circuits to bias each differential input signal for respective coupling to said different conductivity type FETs.

22. A differential signal detector, comprising:
a full wave rectifier having a circuit configuration defined by (a) a pair of first field effect transistors (FETs) of different conductivity type having respective source terminals connected together and respective control gates each coupled to one of a pair of differential inputs, one of said pair of first FETs having a drain coupled to a first output node, and (b) a pair of second FETs of different conductivity type having respective source terminals connected together and respective control gates each coupled to one of the pair of differential inputs, one of said pair of second FETs having a conductivity type in common with said one of said pair of first FETs and having a drain coupled to said first output node, an output voltage being generated at said first output node responsive to detection of a differential input signal at said control gates of said pair of first FETs or said pair of second FETs;
a reference voltage circuit having a circuit configuration in common with said full wave rectifier, said reference voltage circuit having a second output node generating a reference voltage having compensation for common mode effects; and
a comparator having a first input couple to said first output node and a second input coupled to said second output, said comparator generating an output signal indicative of a differential input signal being detected responsive to a voltage at said first output node exceeding said reference voltage at said second output node.

23. The differential signal detector as recited in claim 22, where said reference voltage circuit configuration includes (a) a pair of third FETs of different conductivity type with respective source terminals being connected together, each third FET having a control gate coupled to one input of the pair of differential inputs, one of said pair of third FETs having a drain coupled to said second output node, and (b) a pair of fourth FETs of different conductivity type with respective source terminals being connected together, each fourth FET having a control gate coupled to another input of the pair of differential inputs, one of said pair of fourth FETs having a drain coupled to said second output node.

24. The differential signal detector as recited in claim 22, further comprising a first load resistance coupled to said first output node and a second load resistance coupled to said second output node.

25. A differential signal detector, comprising:
a pair of differential inputs;
a full wave rectifier coupled to said pair of differential inputs for detecting both high and low envelopes of signals at said pair of differential inputs and providing a sense signal at an output thereof;
a reference voltage circuit having inputs coupled to said pair of differential inputs for compensating a reference voltage output therefrom, said reference voltage circuit having a circuit configuration in common with said full wave rectifier; and
a comparator having a first input couple to said output of said full wave rectifier and a second input coupled to said output of said reference voltage circuit, said comparator generating an output signal indicative of a differential input signal being detected responsive to a voltage of said sense signal being greater than said reference voltage.

26. The differential signal detector as recited in claim 25, where said full wave rectifier has a first circuit portion coupled to said pair of differential inputs for detecting said high envelope, and a second circuit portion coupled to said pair of differential inputs for detecting said low envelope, said first and second circuit portions having a circuit configuration in common.

27. The differential signal detector as recited in claim 26, where each of said first and second circuit portions each includes a pair of field effect transistors (FETs) of different conductivity type having respective source terminals connected together and the drain of one of the pair of FETs coupled to an output node.

28. The differential signal detector as recited in claim 25, where said reference voltage circuit includes a first circuit portion coupled to one of said pair of differential inputs and a second circuit portion coupled to the other of said pair of differential inputs.

29. The differential signal detector as recited in claim 28, where each of said first and second circuit portions of said reference voltage circuit includes a pair of field effect transistors (FETs) of different conductivity type having respective source terminals connected together and the drain of one of the pair of FETs coupled to an output node.

* * * * *